(12) United States Patent
Fan et al.

(10) Patent No.: US 10,403,806 B2
(45) Date of Patent: Sep. 3, 2019

(54) LIGHT EMITTING DIODE ASSEMBLY USING THERMAL PYROLYTIC GRAPHITE FOR THERMAL MANAGEMENT

(71) Applicant: Momentive Performance Materials Inc., Waterford, NY (US)

(72) Inventors: Wei Fan, Strongsville, OH (US); Eelco Galestien, Eijsden-Margraten (NL); Creighton Tomek, Cleveland, OH (US); Manjunath Subbanna, Bangalore (IN)

(73) Assignee: Momentive Performance Materials Inc., Waterford, NY (US)

( * ) Notice: Subject to any disclaimer, the term of this patent is extended or adjusted under 35 U.S.C. 154(b) by 0 days.

(21) Appl. No.: 15/572,522

(22) PCT Filed: May 13, 2016

(86) PCT No.: PCT/US2016/032269
§ 371 (c)(1),
(2) Date: Nov. 8, 2017

(87) PCT Pub. No.: WO2016/186985
PCT Pub. Date: Nov. 24, 2016

(65) Prior Publication Data
US 2018/0159008 A1   Jun. 7, 2018

Related U.S. Application Data

(60) Provisional application No. 62/161,970, filed on May 15, 2015.

(51) Int. Cl.
*H01L 33/64* (2010.01)
*H01L 23/373* (2006.01)
(Continued)

(52) U.S. Cl.
CPC .......... *H01L 33/641* (2013.01); *F21S 41/141* (2018.01); *F21S 41/148* (2018.01);
(Continued)

(58) Field of Classification Search
CPC ................... H01L 33/641; H01L 33/64; H01L 23/373–3738; F21S 45/48; F21S 41/141; F21S 45/47
See application file for complete search history.

(56) References Cited

U.S. PATENT DOCUMENTS

| 8,230,690 | B1 * | 7/2012 | Salessi ............ F21V 3/00 165/185 |
| 2004/0001317 | A1 | 1/2004 | Getz et al. |

(Continued)

FOREIGN PATENT DOCUMENTS

| WO | 2005048298 | 5/2005 |
| WO | 2014052282 | 4/2014 |

OTHER PUBLICATIONS

Patent Cooperation Treaty (PCT), International Search Report and Written Opinion for Application PCT/US2016/032269 filed May 13, 2016, dated Jun. 22, 2016, International Searching Authority, EP.

*Primary Examiner* — Selim U Ahmed
*Assistant Examiner* — Evan G Clinton
(74) *Attorney, Agent, or Firm* — Joseph Waters; McDonald Hopkins LLC

(57) ABSTRACT

A light emitting diode assembly comprising such thermal management assembly is shown and described herein. The light emitting diode assembly may comprise a light emitting diode in thermal contact with a heat spreader. The heat spreader may comprise a core and/or fins. The core and/or fins comprise a thermal pyrolytic graphite material. The
(Continued)

thermal management assembly comprising the core and/or fins can dissipate heat from the light emitting diode.

16 Claims, 10 Drawing Sheets

(51) Int. Cl.
*F21V 29/87* (2015.01)
*F21S 41/141* (2018.01)
*F21S 45/47* (2018.01)
*F21S 41/148* (2018.01)
*F21Y 101/00* (2016.01)
*F21Y 115/10* (2016.01)
*F21Y 107/90* (2016.01)

(52) U.S. Cl.
CPC .............. *F21S 45/47* (2018.01); *F21V 29/87* (2015.01); *H01L 23/373* (2013.01); *H01L 33/642* (2013.01); *H01L 33/648* (2013.01); *F21Y 2101/00* (2013.01); *F21Y 2107/90* (2016.08); *F21Y 2115/10* (2016.08)

(56) References Cited

U.S. PATENT DOCUMENTS

| | | | |
|---|---|---|---|
| 2007/0053168 A1* | 3/2007 | Sayir | B32B 18/00 361/718 |
| 2009/0095461 A1 | 4/2009 | Lemark et al. | |
| 2010/0321950 A1* | 12/2010 | Wong | F21V 29/30 362/547 |
| 2010/0326645 A1* | 12/2010 | Fan | B82Y 30/00 165/185 |
| 2013/0313606 A1 | 11/2013 | Weng et al. | |
| 2015/0003482 A1* | 1/2015 | Monadgemi | H01S 5/02292 372/44.01 |
| 2017/0138550 A1* | 5/2017 | Willwohl | F21K 9/66 |

* cited by examiner

LIGHT EMITTING DIODE ASSEMBLY USING THERMAL PYROLYTIC GRAPHITE FOR THERMAL MANAGEMENT

CROSS REFERENCE TO RELATED APPLICATIONS

The present application claims priority to and the benefit of International Application PCT/US2016/032269, titled "LIGHT EMITTING DIODE ASSEMBLY USING THERMAL PYROLYTIC GRAPHITE FOR THERMAL MANAGEMENT," filed on May 13, 2016, which claims the benefit of U.S. Provisional Application No. 62/161,970 entitled "THERMAL PYROLYTIC GRAPHITE ASSEMBLY FOR THERMAL MANAGEMENT OF LIGHT EMITTING DIODES," filed on May 15, 2015, the disclosure of which each is incorporated herein by reference in its entirety.

FIELD OF INVENTION

The present invention relates to a light emitting diode assembly comprising thermal management assembly that can be used to transfer heat away from a heat source; an assembly having the thermal management assembly in contact with the heat source; and methods of manufacturing such assemblies. In particular, the present invention relates to a light emitting diode assembly system and related method comprising thermal pyrolytic graphite for managing heat from a light source.

BACKGROUND

New electronic devices are constantly becoming more powerful and more compact. High power components, including RF/microwave electronics, diode lasers, light emitting diodes (LED), insulated gate bipolar transistors (IGBT), central processing units (CPU), etc., are utilized in a wide variety of industries such as telecommunications, automotive, aerospace, avionics, medical, and materials processing. With these smaller more powerful devices comes an increased requirement to dissipate the heat generated by the devices. The electronics can be damaged by temperature buildup if heat generated during operation is not sufficiently or effectively dissipated. New capabilities and designs are constrained by the ability of designers to remove heat in a cost-effective manner.

LED's are rapidly replacing other lighting solutions in everyday applications. This trend is also seen in the automotive sector. Interior lights have been largely replaced by more efficient, longer lasting LED's, as are some of the exterior lights such as brake lights and turn indicators. With the increase in white LED output power and efficiency, LED headlights are now no longer reserved for high-end luxury vehicles. It is estimated that by 2020, twenty percent of all cars will be equipped with LED headlights. A very similar trend has been observed on video projectors for consumer and commercial uses. Changing from incandescent or high intensity discharge (HID) lighting to LED presents a new set of design challenges. Even though LED is very efficient in converting electricity into light, 70% to 80% of the energy input is dissipated as heat.

Conventional thermal management products for LEDs are typically constructed of either copper (Cu) or aluminum (Al). Such thermal management products are commonly used for extracting heat from a heat source and dissipating the heat into surroundings. Generally, copper is utilized for thermal management at chip levels and aluminum is utilized for higher level thermal management, such as a heat spreader. With the thermal conductivity of copper and aluminum of around 120 to 400 W/m-K, aluminum and/or copper thermal management systems are limited in terms of maximum power loading and design options.

For conventional heat spreaders or heat sinks for LED systems, attempts to provide good thermal management have included increasing cross-section of heat paths, enlarging heat dissipation area, and/or installing forced air cooling or liquid cooling, among other options. However, such attempts require increased dimensions, weight, structure complexity, cost, and/or limit design possibilities. Further, forced air cooling and/or liquid cooling systems are subject to their own limitations or unreliability.

Thermal pyrolytic graphite (TPG), with its metal encapsulated composites (e.g., TC1050® available from Momentive Performance Materials), is an advanced thermal management material serving military and aerospace industries for over a decade. Thermal pyrolytic graphite is formed via a two-step process that provides well-aligned graphene planes to provide a material with superior thermal conductivity (e.g., greater than 1500 W/m-K). Compared to copper, which is commonly used in passive cooling and the most thermally conductive among all the materials mentioned above, thermal pyrolytic graphite can provide four times the cooling power at ¼th the weight of copper.

Traditionally, heat spreaders comprising thermal pyrolytic graphite are formed by encapsulating thermal pyrolytic graphite into a metal casing, such as aluminum, copper, etc. via a diffusion bonding process. Such a process is described in U.S. Pat. No. 6,661,317. The encapsulated thermal pyrolytic graphite composite parts behave like solid metal and can be further machined, plated, or bonded to other components to meet various customers' requirements.

SUMMARY

The following presents a summary of this disclosure to provide a basic understanding of some aspects. This summary is intended to neither identify key or critical elements nor define any limitations of embodiments or claims. Furthermore, this summary may provide a simplified overview of some aspects that may be described in greater detail in other portions of this disclosure.

The present disclosure provides a light emitting diode assembly system using thermal management assembly. The thermal management assembly comprises a core member that is at least partially disposed in a body of the thermal management assembly. The thermal management assembly can also comprise fins extending from the body. In at least one aspect, the core member can comprise a metal-based interlayer disposed between a thermal pyrolytic graphite core material and a surrounding metal or ceramic substrate. The metal-based interlayer provides an interface with the graphite core that allows for excellent thermal conductivity and low thermal resistance.

In at least one aspect, the fin member can comprise a metal-based interlayer disposed between a thermal pyrolytic graphite core material and a surrounding metal or ceramic substrate. The metal-based interlayer provides an interface with the graphite core that allows for excellent thermal conductivity and low thermal resistance.

In at least one aspect, the core member and the fin member can comprise a metal-based interlayer disposed between a thermal pyrolytic graphite core material and a surrounding metal or ceramic substrate. The metal-based interlayer provides an interface with the graphite core that allows for excellent thermal conductivity and low thermal resistance.

In one aspect, the present disclosure provides a thermal management assembly that exhibits low thermal interface resistance. The present disclosure can even provide a thermal interface that is orders of magnitude lower than conventional thermal interface assemblies. Light emitting diode devices can receive greater amounts of power without over heating due to the low thermal resistance.

In one aspect the present disclosure provides a thermal management assembly for a light emitting diode assembly, the thermal management assembly comprising: a heat sink in thermal contact with a support member, wherein the heat sink includes thermal pyrolytic graphite material.

In one embodiment, the heat sink further includes: a first substrate; and a second substrate, wherein the thermal pyrolytic graphite material is at least partially disposed between the first and second substrates. In one embodiment, the first substrate and the second substrate independently comprise a metal or a ceramic material.

In one embodiment, the present disclosure provides a light emitting diode assembly of any previous embodiment, wherein the heat sink comprises a core member comprising a proximal end that is proximal to the light emitting diode assembly and a distal end extending from the proximal end, wherein the core member at least partially comprises the thermal pyrolytic graphite material.

In one embodiment, the present disclosure provides a light emitting diode assembly of any previous embodiment, wherein the heat sink comprises at least one fin at least partially comprising the thermal pyrolytic graphite material. In one embodiment, the at least one fin protrudes from a body member of the thermal management assembly. In one embodiment, the at least one fin is in thermal communication with a core member of the thermal management assembly. In one embodiment, the at least one fin is in thermal communication with the core member of the thermal management assembly.

In one embodiment, the present disclosure provides a light emitting diode assembly of any previous embodiment, further comprising a forced air device disposed proximal to the heat sink device.

In one embodiment, the present disclosure provides a light emitting diode of any previous embodiment, further comprising a liquid cooling device disposed proximal to the heat sink device.

In another aspect, the present disclosure provides a thermal management assembly for a light emitting diode assembly, comprising: a body member in thermal communication with the light emitting diode device, and wherein the body member at least partially comprises a thermal pyrolytic graphite material disposed between a first substrate and a second substrate.

In one embodiment, the first substrate and the second substrate are formed from a metal or a ceramic material.

In one embodiment, the present disclosure provides a thermal management assembly of any previous embodiment, wherein the body member further comprises interlayers disposed between the thermally conductive material and the first substrate, and between the thermally conductive material and the second substrate, wherein the interlayers comprise a metal-based material.

In one embodiment, the interlayers comprise a metal based material comprising an activating material that is chosen from titanium, zirconium, hafnium, aluminum, tantalum, iron, silicon, or a combination of two or more thereof to form a carbide.

In one embodiment, the present disclosure provides a light emitting diode assembly of any previous embodiment, further comprising at least one fin member extending from and in thermal communication with the body member. In one embodiment, the at least one fin member at least partially comprising the thermal pyrolytic graphite material.

In one embodiment, the present disclosure provides a light emitting diode assembly of any previous embodiment, the thermal management assembly comprises a thermal management assembly for an automotive headlight device.

In still another aspect, the present disclosure provides management light emitting diode assembly for a light emitting diode device, comprising: a body member in thermal communication with the light emitting diode; and a fin member extending from and in thermal communication with the body member, wherein the fin member partially comprises a thermal pyrolytic graphite material.

In one embodiment, the fin member at least partially comprises the thermal pyrolytic graphite material.

In one embodiment, the light emitting diode assembly comprises a thermal management assembly for an automotive headlight device.

In yet another aspect, the present disclosure provides a light emitting diode assembly comprising the thermal management assembly according to any previous aspect or embodiment.

In a further aspect, the present disclosure provides a light emitting diode assembly, comprising: at least one light emitting diode; a body member in thermal communication with the at least one light emitting diode; wherein the body member at least partially comprises a thermal pyrolytic graphite core material disposed between a first substrate and a second substrate.

In one embodiment, the light emitting diode assembly further comprises a fin member extending from and in thermal communication with the body member. In on embodiment, the fin member at least partially comprises a thermal pyrolytic graphite material.

In still another aspect, the present disclosure provides a light emitting diode assembly, comprising: at least one light emitting diode; a body member in thermal communication with the at least one light emitting diode; and at least one fin member extending from and in thermal communication with the body member, wherein a fin member of the at least one fin member partially comprises a thermal pyrolytic graphite material. In one embodiment, the body member further comprises an electrical connection coupled to the at least one light emitting diode.

The following description and the drawings disclose various illustrative aspects. Some improvements and novel aspects may be expressly identified, while others may be apparent from the description and drawings.

BRIEF DESCRIPTION OF THE DRAWINGS

The accompanying drawings illustrate various systems, apparatuses, devices and related methods, in which like reference characters refer to like parts throughout, and in which.

DETAILED DESCRIPTION

Figure 1:
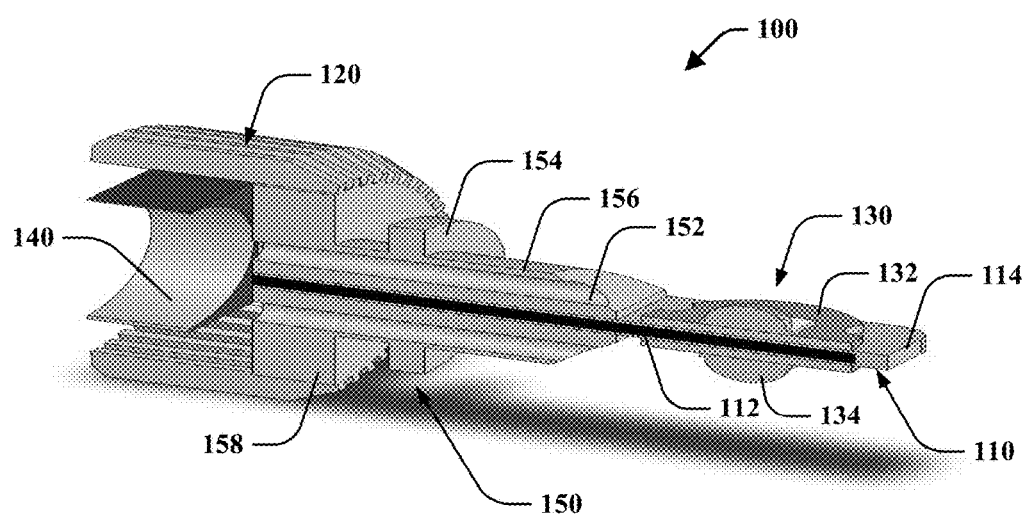
FIG. 1 illustrates a partial cross-sectional view of a light emitting diode assembly comprising a thermal pyrolytic graphite core at least partially encapsulated by metal.

Reference will now be made to exemplary embodiments, examples of which are illustrated in the accompanying drawings. It is to be understood that other embodiments may be utilized and structural and functional changes may be made. Moreover, features of the various embodiments may be combined or altered. As such, the following description is presented by way of illustration only and should not limit in any way the various alternatives and modifications that may be made to the illustrated embodiments. In this disclosure, numerous specific details provide a thorough understanding of the subject disclosure. It should be understood that aspects of this disclosure may be practiced with other embodiments not necessarily including all aspects described herein, etc.

As used herein, the words "example" and "exemplary" means an instance, or illustration. The words "example" or "exemplary" do not indicate a key or preferred aspect or embodiment. The word "or" is intended to be inclusive rather than exclusive, unless context suggests otherwise. As an example, the phrase "A employs B or C," includes any inclusive permutation (e.g., A employs B; A employs C; or A employs both B and C). As another matter, the articles "a" and "an" are generally intended to mean "one or more" unless context suggest otherwise.

As used herein, the term "thermal management assembly" refers to a thermal management device or a heat transfer device comprising a high thermal conductivity material for dissipating or removing heat from a heat source. A thermal management assembly can include, but is not limited to, heat spreaders, heat sinks, cold plates, heat exchangers, flange, substrate, or the likes. Such terms may be utilized interchangeably herein, unless context suggests otherwise or warrants a particular distinction among such terms.

In some traditional thermal management systems, copper, aluminum, and/or other materials are used for a heat sink. These systems can suffer from a number of deficiencies, such as a low maximum power, low efficiencies, low run-time, design restrictions (e.g., relatively large minimum size), or the likes. Embodiments described herein can increase efficiencies of thermal management systems, increase maximum power that can be utilized by a light system, increase maximum runtimes, allow for greater numbers of designs, or otherwise improve upon traditional thermal management systems.

Heat sinks or heat spreaders made of aluminum are traditionally used for extracting heat from the light emitting diodes and dissipating it to the surroundings. Heat sinks made of copper, which has higher heat conduction power, are generally used at chip level thermal management. With their thermal conductivity of 120 to 400 W/m-K, aluminum and copper based thermal management solutions limit the maximal power loading to light emitting diodes and the design options. Typical practices to improve the heat sink efficiency include increasing the cross-section of heat path, enlarging the heat dissipation area, installing forced air cooling or liquid cooling, and the likes. Such practices not only add size and weight, but complexity and cost to thermal management assemblies. The long-term reliability of the forced air cooling or liquid cooling is also a major concern for most of the high power light emitting diode applications.

Because of their small size and high power capabilities, thermal management of light emitting diode headlights can benefit from more efficient management of thermal energy. Lowering the light emitting diode junction temperature will improve its efficiency and lifetime. While embodiments described herein may reference a particular application, such as automotive applications and in particular automotive headlights, it is noted that various aspects of this disclosure are applicable in other applications. For instance, embodiments disclosed herein may be used or adapted for use in building lighting fixtures (e.g., lamps, recessed lighting, flood lighting, etc.), consumer products (e.g., hand-held lighting systems, televisions, computers, projectors, etc.), other transportation devices (e.g., aviation vehicles, etc.), spot lights, stadium lights, theatrical light, UV lights or other high power lighting devices, and other applications.

Various embodiments described herein relate to a thermal management assembly that can facilitate dissipation of thermal energy from a light source, such as a light emitting diode system. In one or more aspects, the largest thermal resistance in heat flow paths typically reside at LED substrates, fin members, and base members. As described herein, thermal pyrolytic graphite material can be utilized for one or more of LED substrates, fin members, or base members to significantly, with respect to traditional systems, reduce the thermal resistances at those locations and, thus, improve a heat sink's performance. In at least one embodiment of an automotive headlight assembly, an overall of at least 51% thermal resistance reduction can be achieved with a thermal pyrolytic graphite core and thermal pyrolytic graphite fin members. This can be translated into a 100% increase in power loading to light emitting diodes without raising the junction temperature. It has also been demonstrated that the thermal pyrolytic graphite core and fins can also eliminate the use and/or need for forced air (e.g., fan-based) or liquid-based cooling devices.

In an exemplary embodiment, a thermal management assembly can thermally connect with the light emitting diode system, such as through a core member. In an aspect, the core member can also thermally connect with fin members. In another aspect, the core member can be configured to disperse thermal energy from the light emitting diode system to an environment or other component or member, such as the fin members.

Fin members can comprise fin shaped members that are generally flat (e.g., portions of a fin member are generally uniform in thickness) and extend from a body or core of the thermal management assembly. Such fin members may comprise various shapes and dimensions. For instance, the fins may be generally rectangular, generally triangular, generally elliptical, irregular shaped, or the likes. It is further noted that fin members can include any number of desired fin members. Various described embodiments may depict or reference fin members having a particular shape, configured in a particular arrangement, or comprising a particular number of fin members for sake of brevity. Thus, it is noted that such embodiments can utilize fin members comprising different shapes, configured in different arrangements, or comprising any number of fin members.

Fin members or core members may be comprised of a thermal pyrolytic graphite core material. Further, fin members or core members may be comprised of a thermal pyrolytic graphite core material at least partially surrounded by an interlayer that at least partially coats or surrounds a surface of the thermal pyrolytic graphite core material. In at least one embodiment, the interlayer may be disposed between the thermal pyrolytic graphite core material and surrounding or coating material, such as metal or ceramic substrates. The surrounding or coating material can provide an interface with the thermal pyrolytic graphite core material that can allow for altered (e.g., increased with respect to other materials) thermal conductivity and altered (e.g., decreased with respect to other materials) thermal resistance.

FIG. 1 illustrates an embodiment of a light emitting diode assembly 100 in accordance with aspects and embodiments of this disclosure. Light emitting diode assembly 100 can primarily comprise a core member 110 that extends within a body member 150, fin members 120 protruding from the body member 150, and a forced air member 140. It is noted that light emitting diode assembly 100 can comprise other configurations and/or components not shown for sake of brevity.

In an aspect, light emitting diode 130 may be thermally connected with core member 110. For instance, light emitting diode 130 may be disposed near a proximal end of core member 110. Light emitting diode 130 may include a light emitting diode die or support member 132 that may be connected (removably or irremovably) to core member 110. Core member 110 may receive heat from light emitting diode 130 and may disperse or propagate heat towards a distal end of core member 110. Core member 110 may also be at least partially disposed within body member 150 and/or body member 150 may comprise a portion of core member 110 surrounded by additional material, such as support member 156.

Body member 150 may comprise support member 156 that may surround or support at least a portion of core member 110. In another aspect, support member 156 can comprise one or more apertures 152 running substantially parallel with core member 110. The one or more apertures 152 may be configured to receive a wire, such as a wire from a power supply. Body member 150 can further include a locking or clasping member 154 that can be configured to lock light emitting diode assembly 100 into a larger device or apparatus, such as a headlight body or frame. Body member 150 can also comprise base member 158 that is displaced at or near a distal end of core member 110. Fin members 120 may extend from an outer perimeter of base member 158. In an aspect, fin members 120 may increase a surface area of light emitting diode assembly 100.

In various embodiments, light emitting diode assembly 100 can include or can otherwise be configured to operate with a fan member 140. Fan member 140 can comprise one or more blades of air manipulating members and a motor (not shown). The motor can drive or otherwise control movement of the air manipulation member. The motor can be powered by electricity, manual means, or other means. It is noted that one or more power sources can be configured to provide power to the motor and to light emitting diode 130.

Core member 110 may comprise a thermal management core 112 and a substrate 114. Thermal management core 112 may be at least partially disposed within substrate 114. In one embodiment, thermal management core 112 comprises thermal pyrolytic graphite. In at least one embodiment, substrate 114 can completely encapsulate thermal pyrolytic graphite core 112. Moreover, while embodiments describe a thermal pyrolytic graphite core 112 encapsulated, sandwiched, or surrounded by substrate 114, it is noted that one or more layers of thermal pyrolytic graphite, substrates, or additives may be encapsulated, sandwiched, or surrounded by substrate 114.

Figure 2:
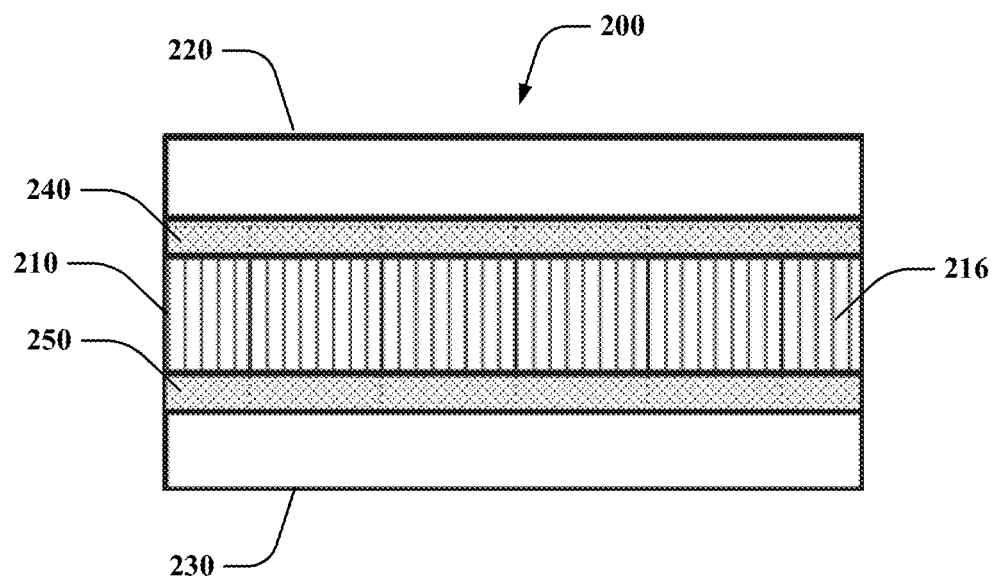
FIG. 2 illustrates a cross-sectional view of a thermal management member in accordance with an embodiment of the present invention.
Figure 3:
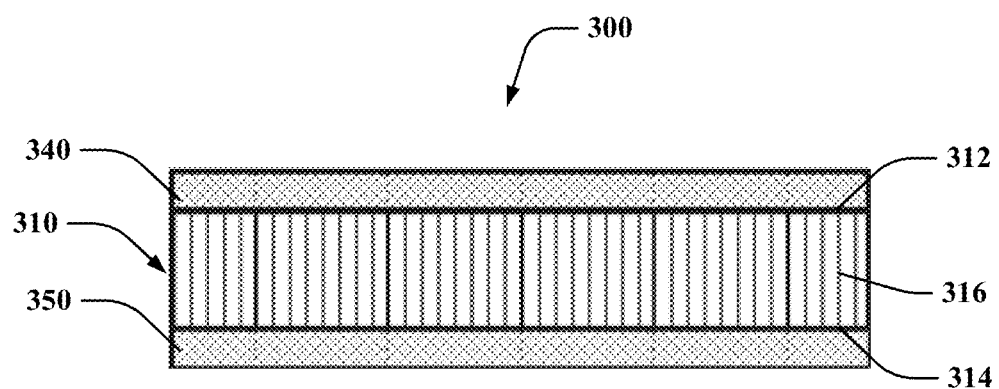
FIG. 3 illustrates a cross-sectional view of another embodiment of a thermal management member in accordance with aspects of the present invention.

Turning to FIGS. 2 and 3, with reference to FIG. 1, illustrated are cross-sectional views of a thermal pyrolytic graphite member 200 and a thermal management member 300 in accordance with aspects and embodiments of this disclosure. As an example, thermal pyrolytic graphite member 200 or thermal management member 300 can be a cross-sectional view of at least a portion of the thermal pyrolytic graphite core 112 or a fin member of fin members 120 of FIG. 1.

It is noted that like named components or members may comprise substantially similar functionality, aspects or configurations, unless context suggests otherwise or warrants a particular distinction among such components or members. For instance, thermal pyrolytic graphite layer 210 and thermal pyrolytic graphite layer 310 can include substantially similar materials or configurations.

As depicted, thermal management member 300 can primarily include thermal pyrolytic graphite layer 310 and coating layers 340 and 350. Coating layers 340 and 350 can be respectively disposed on a first surface 312 of thermal pyrolytic graphite layer 310 and a second surface 314 of thermal pyrolytic graphite layer 310. The thermal pyrolytic graphite layer 310 includes graphite layers 316 disposed therein. In at least one embodiment, graphite layers 316 can be oriented perpendicular or parallel to a plane of the coating layers 340 and 350. However, it is noted that other orientations can be utilized. Coating layers 340 and 350 are formed from a metal-based material through a coating process such as plating, physical vapor deposition, chemical vapor deposition, spin coating, diffusion bonding, soldering, or brazing. In embodiments, the metal-based coating material can be formed from an alloy comprising an agent that is reactive with the thermal pyrolytic graphite to form a carbide. Any of the materials that can be used as coating layers described with reference to FIG. 2 can be used to form coating layers 340 and 350.

Thermal pyrolytic graphite member 200 can include thermal pyrolytic graphite layer 210, substrate layer 220, substrate layer 230, interface layer 240, and interface layer 250. Interface layers 240 and 250 can be disposed at the interface between the substrate layers 220/230 and the thermal pyrolytic graphite layer 210, respectively. The interface layers 240 and 250 may be an active or non-active coating as may be desired. The interface layers may be applied through any suitable coating method based on the material used for the interface layer. In embodiments, the interface layer can be provided via a coating process such as, but not limited to, plating, physical vapor deposition, chemical vapor deposition, spin coating, diffusion bonding, soldering, or brazing. In the embodiment of FIG. 2, the interface layers 240 and 250 may also be referred to as interlayers or filler.

The thermal pyrolytic graphite layers 210 and 310 can be formed from one or more layers of thermal pyrolytic graphite. As used herein, the term "thermal pyrolytic graphite" ("TPG") encompasses materials such as highly oriented pyrolytic graphite ("HOPG"), or compression annealed pyrolytic graphite ("CAPG"). In one embodiment, thermal pyrolytic graphite may also refer to graphite materials consisting of crystallites of considerable size, the crystallites being highly aligned or oriented with respect to each other and having well-ordered carbon layers or a high degree of preferred crystallite orientation. In one embodiment, the thermal pyrolytic graphite has an in-plane (a-b direction) thermal conductivity greater than 1,000 W/m-K; greater than 1100 W/mK; greater than 1200 W/mK; even greater than 1,500 W/m-K. Here as elsewhere in the specification and claims, numerical values can be combined to form new and non-disclosed ranges. Furthermore, numerical values may be examples of embodiments or may be represented in terms of other values, nomenclatures, or the likes.

The thermal pyrolytic graphite can be provided in any suitable form. In one embodiment, the thermal pyrolytic graphite is provided as a sheet or strip. The thermal pyrolytic graphite layer 210 can have any size or thickness as desired for a particular purpose or intended use, such as in light emitting diode assembly 100. In at least one embodiment, the thermal pyrolytic graphite layer 210 can have a thickness of from about 0.1 mm to about 5 mm; from about 1 mm to about 4 mm; even from about 2 to about 3 mm. In embodiments, the thermal pyrolytic graphite layer 210 can have a thickness of from about 25% to about 95% of the total thickness of the thermal management member 200; from about 35% to about 90% of the total thickness of the thermal management member 200; from about 40% to about 80% of the total thickness of the thermal management member 200; even from about 50% to about 75% of the total thickness of the thermal management member 200. Here as elsewhere in the specification and claims, numerical values can be combined to form new and non-disclosed ranges.

In at least one embodiment, the thermal pyrolytic graphite layer may have a thickness of 2 mm in the core and may comprise 57% of the total thickness of the core. In another aspect, the fins 120 may include nine thermal pyrolytic graphite sheets with the thickness of 0.69 mm disposed on the heat spreader body for heat dissipation to the surrounding environment. In an example, system 100 may include multiple thermal pyrolytic graphite fins with a thickness of 0.69 mm disposed on the heat spreader body with a thermal pyrolytic graphite core, which had a thickness of 2 mm.

The thermal management member 200 can be configured as desired for a particular purpose or intended application. In one embodiment, the thermal pyrolytic graphite layer 210 is disposed in thermal management member 200 such that graphite layers 216 and graphene planes are oriented substantially parallel to the substrate layers 220 and 230. In another embodiment, the thermal pyrolytic graphite layer 210 comprises thermal pyrolytic graphite disposed in the thermal management member 200 such that the graphene planes or graphite layers 216 are oriented perpendicular to the substrate layers 220 and 230. In FIG. 2, the graphite layers 216 are oriented perpendicular to the plane of the substrate layers 220 and 230.

The substrate layers 220 and 230 can be formed from any suitable metal or ceramic material as desired for a particular purpose or intended application, such as for light emitting diode assembly 100. Examples of suitable metals for the substrate layers 220 and 230 include, but are not limited to, copper, aluminum, tungsten, molybdenum, nickel, iron, tin, silver, gold, beryllium or alloys of two or more thereof. Examples of suitable ceramics for the substrate layers 220 and 230 include, but are not limited to, silicon nitride, silicon carbide, aluminum nitride, aluminum oxide, beryllium oxide, boron nitride, etc. Substrate layers 220 and 230 can be made from the same or different metal materials. The thickness of the substrate layers 220 and 230 can be selected as desired for a particular purpose or intended application. The thicknesses can be the same or different. In one embodiment, the substrate layers 220 and 230 may each have a thickness of from about 2 microns to about 2 mm. Here as elsewhere in the specification and claims, numerical values can be combined to form new and non-disclosed ranges.

The thermal management member 200 comprises interface layers 240 and 250, which can be metal-based layers disposed on opposing surfaces of the thermal pyrolytic graphite layer 210. The metal-based material can serve as an outer layer (as described in FIG. 3) or a layer for bonding the thermal pyrolytic graphite layer 210 to the substrate layers 220 and 230. In one embodiment, the metal-based coating material of interface layers 240 and 250 can comprise an agent that can form a carbide with thermal pyrolytic graphite at a sufficiently high temperature. Generally, the metal-based bonding material has a lower melting temperature than either the thermal pyrolytic graphite layer 210 or the substrate layers 220 and 230. The bonding can be achieved via soldering or brazing. In one embodiment, the metal-based coating material for the interface layer(s) has a thermal conductivity of about 20 W/mK or greater. In embodiments, the metal-based coating material can comprise any suitable metal or alloy including, but not limited to, silver, silver-copper, tin, lead, etc., that melts and bonds to the surrounding metal or ceramic substrate of substrate layers 220 or 230 at an elevated temperature lower than the substrate melting temperature. In one embodiment, the material for the interface layer(s) is one that can form a carbide with thermal pyrolytic graphite at a sufficiently high temperature. In one embodiment, the material for the interface layer is chosen from titanium, zirconium, hafnium, aluminum, tantalum, iron, silicon, tin, or a combination of two or more thereof. Examples of suitable braze and solder alloys that can be used to bond thermal pyrolytic graphite to various materials include but are not limited to Al, Si, Fe, Al—Si, Fe—Si, Ag—Cu—Ti, Ti—Ni, Ni—Pd—Ti, Sn—Ti, Sn—Al, and Sn—Ag—Ti. In one embodiment, the metal-based coating material has a composition different than the composition of the substrate layers.

The thermal management member 200 can be formed by disposing a thermal pyrolytic graphite material between substrate layers 240 and 250 and joining the substrate layers via the interface material. The interface material can be applied to opposing surfaces of the pyrolytic graphite material, and the substrate material can be disposed on the surfaces of the graphite comprising the interface material, the thermal management member 200 can be subjected to joining under vacuum at a temperature above the melting temperature of the interface material and below the melting temperature of the core or the substrates.

Figure 4:
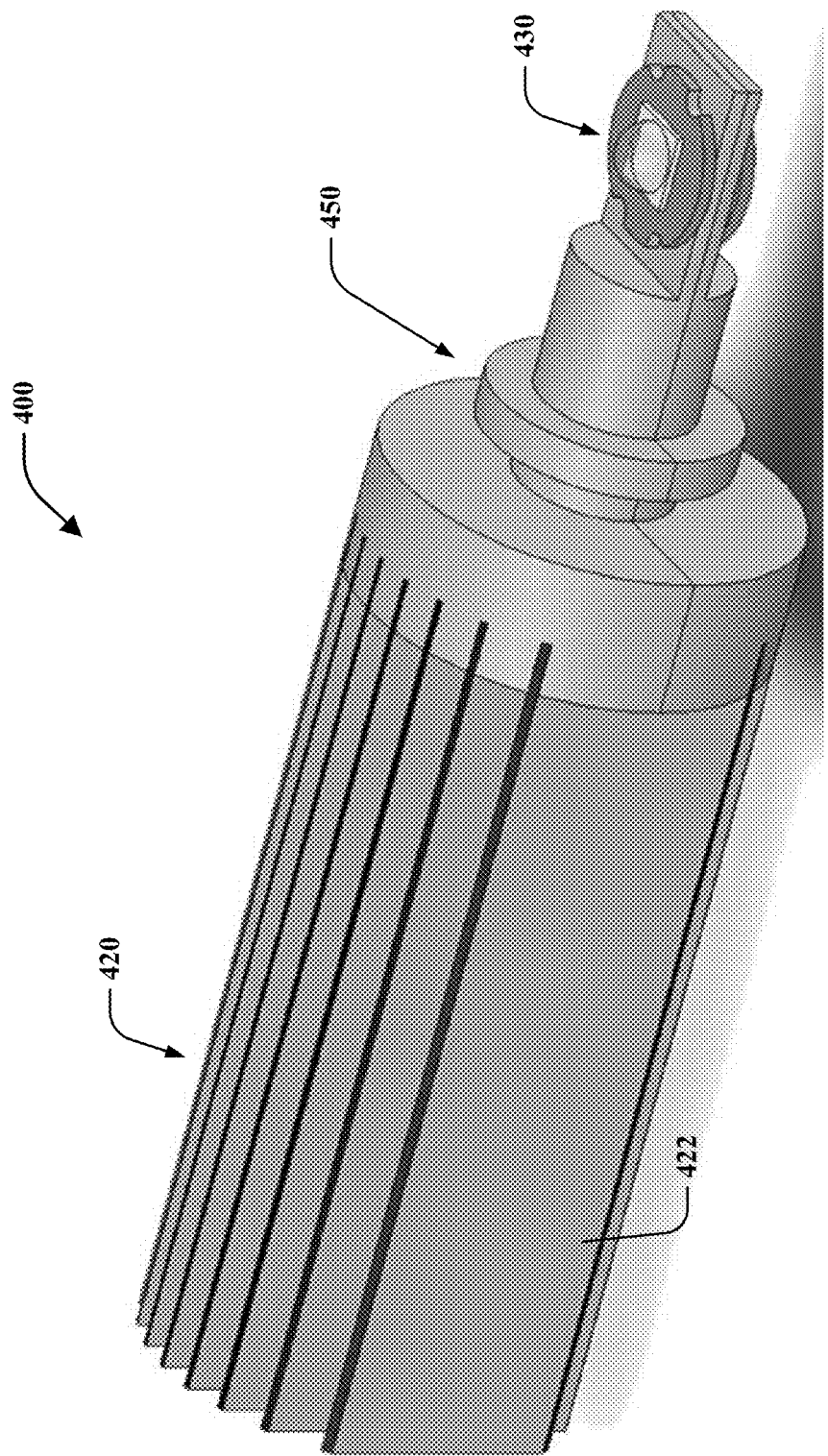
FIG. 4 illustrates a perspective view of a light emitting diode assembly comprising fin members comprising a thermal pyrolytic graphite material at least partially encapsulated by metal.

FIG. 4 is an embodiment of a light emitting diode assembly 400 in accordance with aspects and embodiments of this disclosure. For example, light emitting diode assembly 400 may comprise a heat spreader for a lighting system, such as for a light emitting diode system. It is noted that various configurations can be utilized and have been considered by the Applicants. Accordingly, light emitting diode assembly 400 is an exemplary embodiment of such configurations.

Light emitting diode assembly 400 can primarily include a lighting system 430, body member 450, and fin members 420 comprising one or more fin members 422. The fin members 420 may comprise a thermal pyrolytic graphite material that is sandwiched or at least partially encapsulated by coating layer. Likewise, the interlayer may be sandwiched or at least partially encapsulated by a substrate material. For instance, fin member 422 may comprise a sheet or strip of metalized thermal pyrolytic graphite, such as thermal pyrolytic members 200 and 300.

As depicted, fin members 420 may be attached to body member 450 and may extend from a proximal end of fin members 420 to a distal end of fin members. Fin members 420 are configured to extend from a generally cylindrical base of body member 450 and may represent cross-sections of a cylinder or a generally cylindrical shaped prism. While depicted as having generally equal spacing between each of fin members 420, it is noted that spacing between fin members 420 may be different. Likewise, though fin members 420 are depicted as generally flat, generally parallel with each other, generally equal thicknesses in comparison with each other, and generally of equal length, it is noted that various other embodiments may have different configurations. Moreover, each fin member (e.g., fin member 422) of the fin members 420 may be integrally formed, formed of one or more sub-fins, or the likes. For instance, fin member 422 may comprise one solid sheet or strip comprising thermal management member 200 and 300 or any number of smaller sheets or strips of thermal management member 200 and 300. Examples of various embodiments will be discussed in more detail below.

Figure 5:
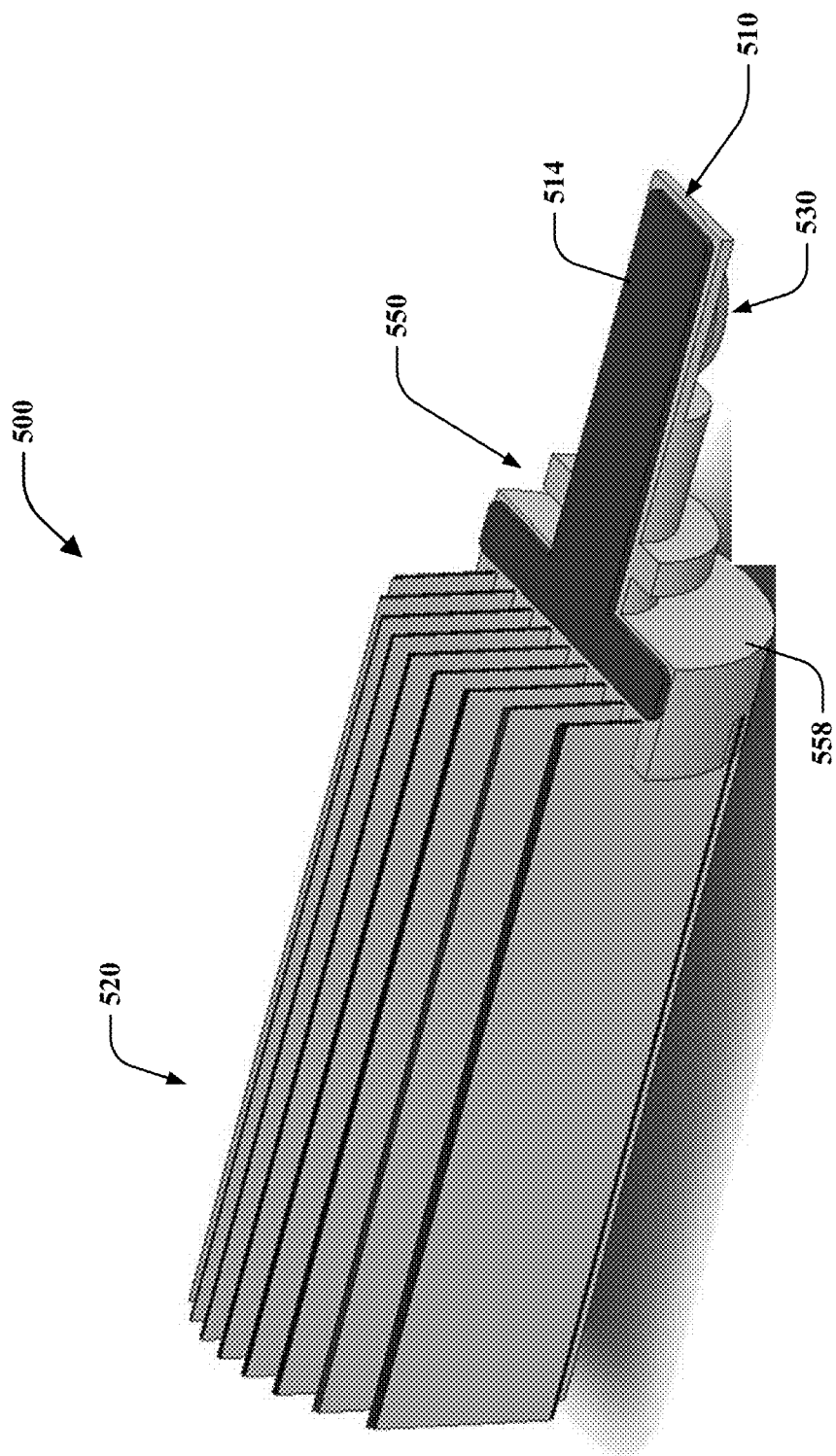
FIG. 5 illustrates a perspective view of a light emitting diode assembly comprising fin members and a core member comprising thermal pyrolytic graphite material at least partially encapsulated by metal.
Figure 6:
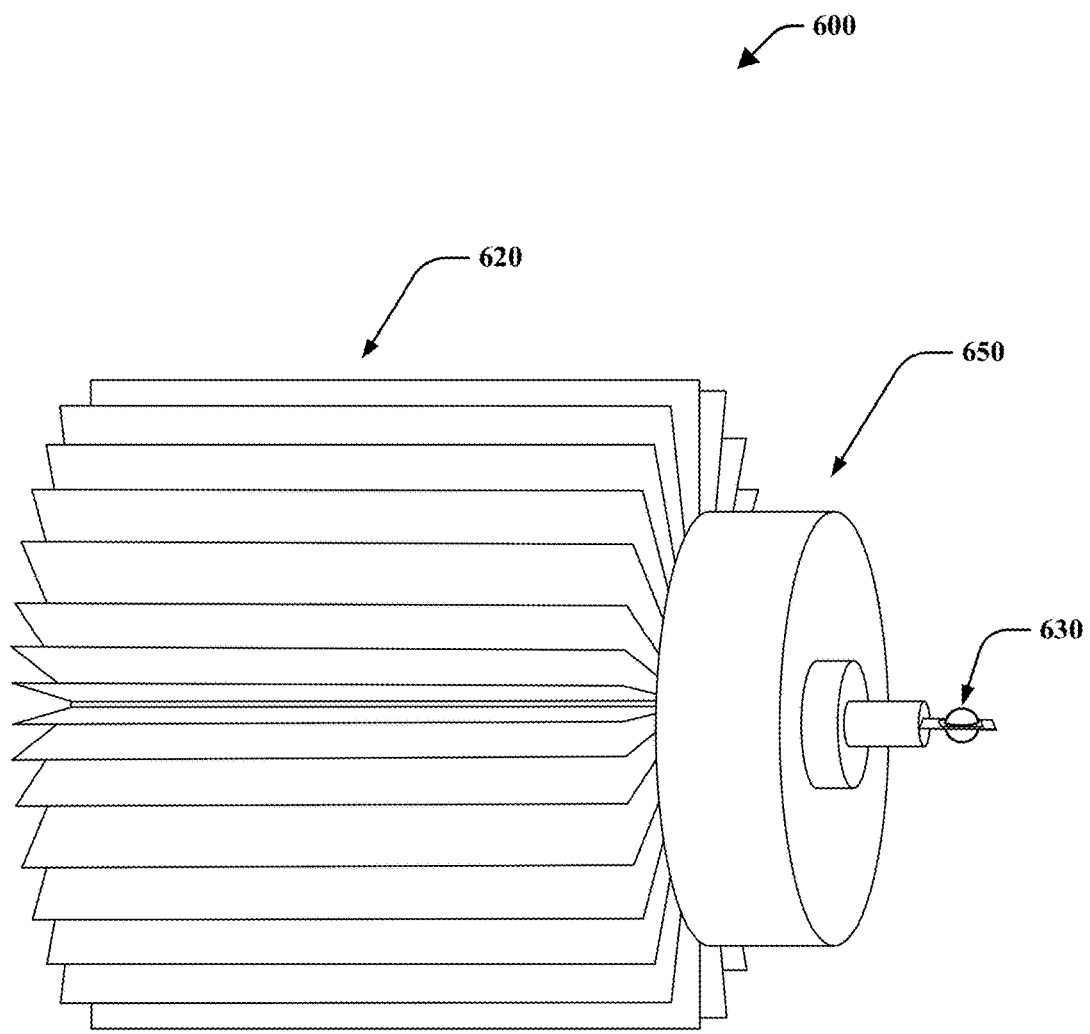
FIG. 6 illustrates a perspective view of a light emitting diode assembly comprising fin members extending radially from an axis in accordance with various embodiments herein.

FIG. 5 illustrates a light emitting diode assembly 500 in accordance with aspects and embodiments of this disclosure. For example, light emitting diode assembly 500 can comprise a heat spreader connected to or integrated with a lighting assembly, such as a light emitting diode assembly.

Light emitting diode assembly 500 can comprise core member 510, body member 550 and fin members 520. In an aspect, light emitting diode assembly 500 can comprise or can be attached to a light emitting diode 530. A thermal pyrolytic graphite material can comprise a thermal pyrolytic graphite core 514, which can be at least partially disposed within core member 510 and/or base member 558. In an aspect, thermal pyrolytic graphite core 514 can be a sheet or planer assembly of thermal pyrolytic graphite material at least partially encased or enclosed within an interface material and/or a substrate. While thermal pyrolytic graphite core 514 is shown as disposed within at least a portion of core member 510 and base member 558, it is noted that core member 510 can be divided into one or more sections of thermal pyrolytic graphite material. For example, base member 558 can comprise a thermal pyrolytic graphite material completely enclosed by a substrate and core member 510 may comprise a thermal pyrolytic graphite material completely enclosed by a substrate. Such enclosed thermal pyrolytic graphite materials may not physically contact each other but may be in thermal communication, such as through one or more substrates.

In another aspect, fin members 520 can be substantially similar to fin members 420. For instance, fin members 520 can comprise one or more thermal pyrolytic graphite materials and an interface material. In other embodiments, fin members 520 also include substrate materials. As described above, various components or members of light emitting diode assembly 500 may comprise different substrates and/or materials. For example, each of fin members 520 can include different substrate materials, interface materials, and/or thermal pyrolytic graphite materials.

Thermal pyrolytic graphite core 514 and fin members 520 can be formed of a single structure or may be assembled from one or more structures. For instance, one or more of fin members 520 may be bonded or joined with body member 550, such as through a soldering or brazing process. It is noted that various other embodiments can comprise different configurations. Likewise, various other processes can be utilized to join or attach fin members 520 to body member 550.

In at least one aspect, light emitting diode assembly 500 may dissipate thermal energy from a heat source, such as light emitting diode 530. For instance, core member 510 can receive thermal energy from light emitting diode 530. Due to the low thermal resistance of thermal pyrolytic graphite core 514, the thermal energy may disperse throughout the thermal pyrolytic material and can travel towards base member 558. The thermal energy may then travel or propagate through one or more of fin members 520. As fin members 520 comprise thermal pyrolytic graphite material, the thermal energy may spread throughout the fin members 520. In an aspect, fin members 520 may increase the overall effective heat dissipation surface area of light emitting diode assembly 500 such that thermal energy can be dispersed in an environment.

FIGS. 6-9 illustrate various exemplary embodiments of light emitting diode assemblies 600, 700, 800, and 900 respectively, in accordance with various disclosed aspects. For instance, the light emitting diode assemblies 600, 700, 800, and/or 900 can comprise heat spreaders for light emitting diodes 630, 730, 830 and 930, respectively.

In an aspect, light emitting diode assemblies 600, 700, 800, and 900 can respectively comprise fin members, 620, 720, 820 and 920. In another aspect, each of the assemblies can further comprise body members 650, 750, 850 and 950, which may or may not include core members. For instance, a substrate of light emitting diode 930 can be attached to a base of body member 950.

As depicted in FIGS. 6-9, various configurations of fin members, body members and light emitting diode assemblies are depicted. For instance, light emitting diode assembly 600 depicts fin members 620 oriented such that fin members extend radially from a central axis. Further, fin members 620 are generally coaxial with body member 650.

Figure 7:
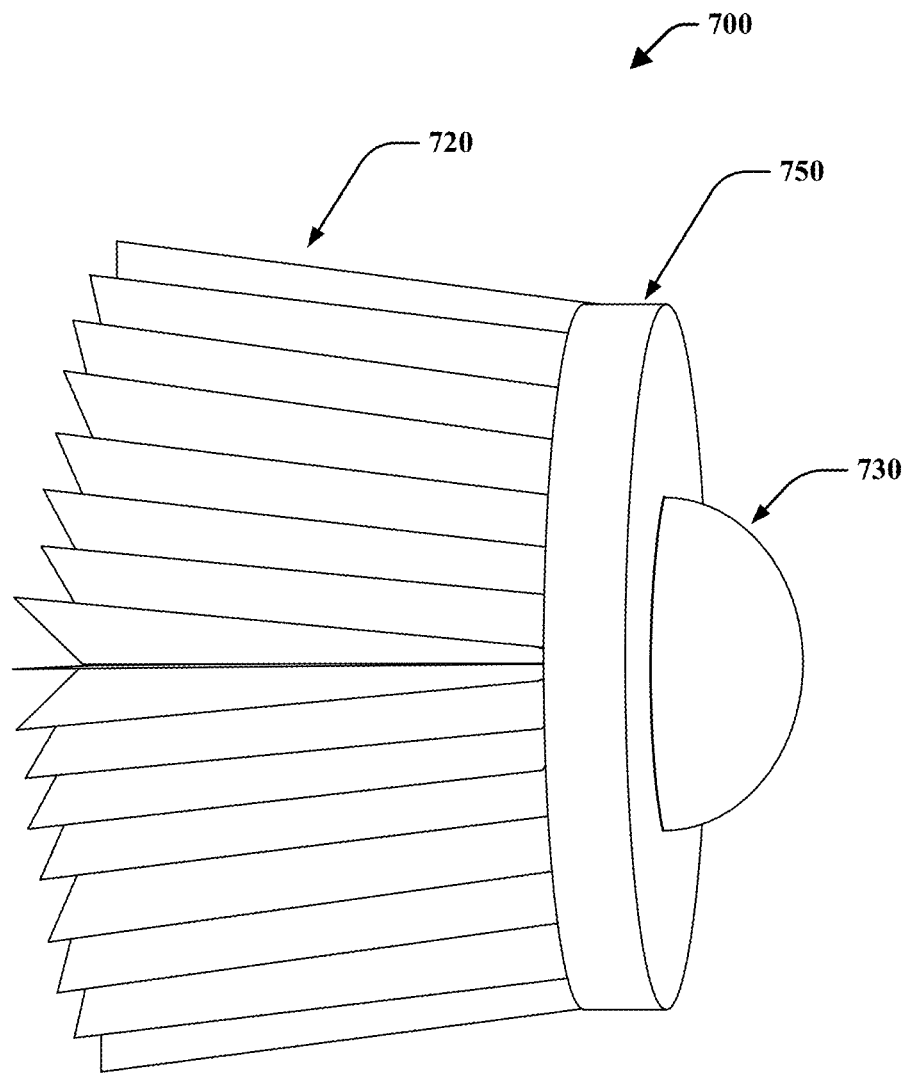
FIG. 7 illustrates a perspective view of another light emitting diode assembly comprising a light emitting diode disposed at an end of a body of the thermal management assembly in accordance with various embodiments herein.

As shown in FIG. 7, light emitting diode assembly 700 can comprise light emitting diode 730 attached directly to body member 750. Fin members 720 are generally coaxial with body member 750. Moreover, fin members 720 are of different shapes than those of fin members 620.

Figure 8:
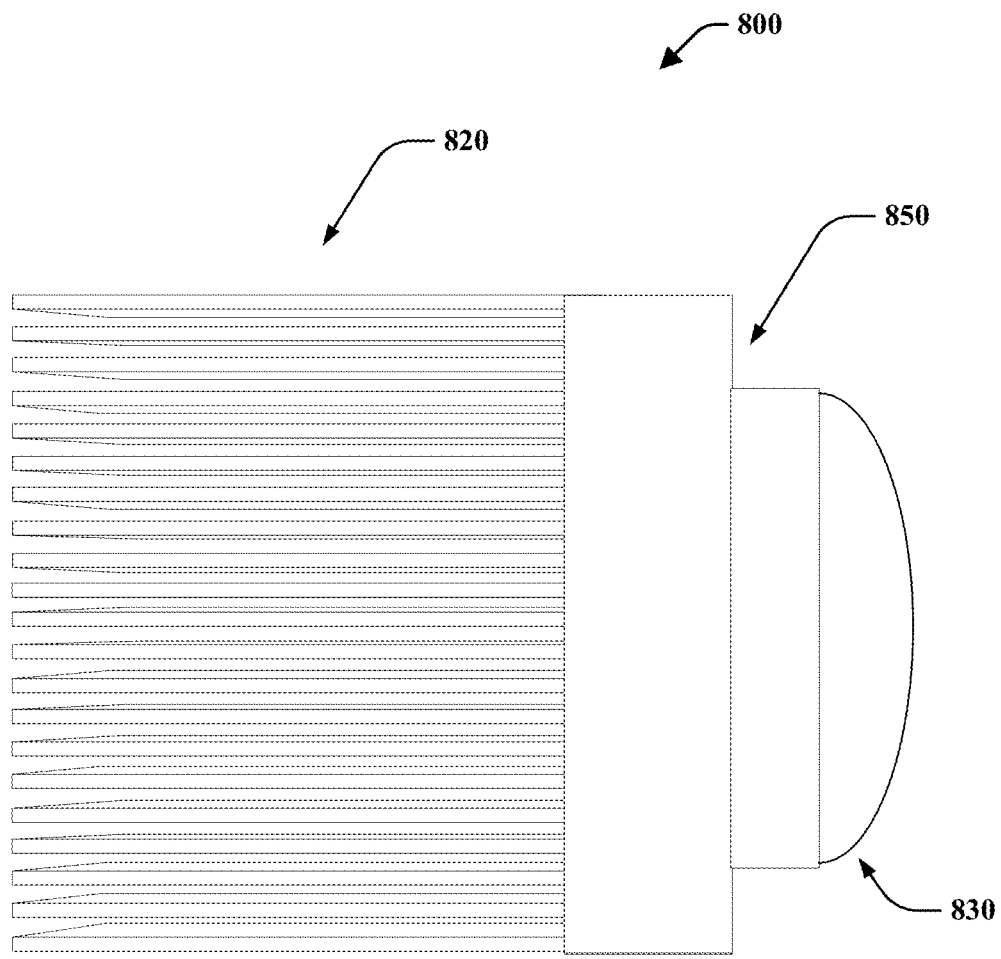
FIG. 8 illustrates a perspective view of another light emitting diode assembly comprising a rectangular configuration in accordance with various embodiments herein.

As illustrated in FIG. 8, light emitting diode assembly 800 comprises a generally square or generally rectangular prism shaped body member 850 having light emitting diode 830 disposed on a first surface. On a second surface of body member 850, generally rectangular or square shaped fin members 820 extend therefrom.

Figure 9:
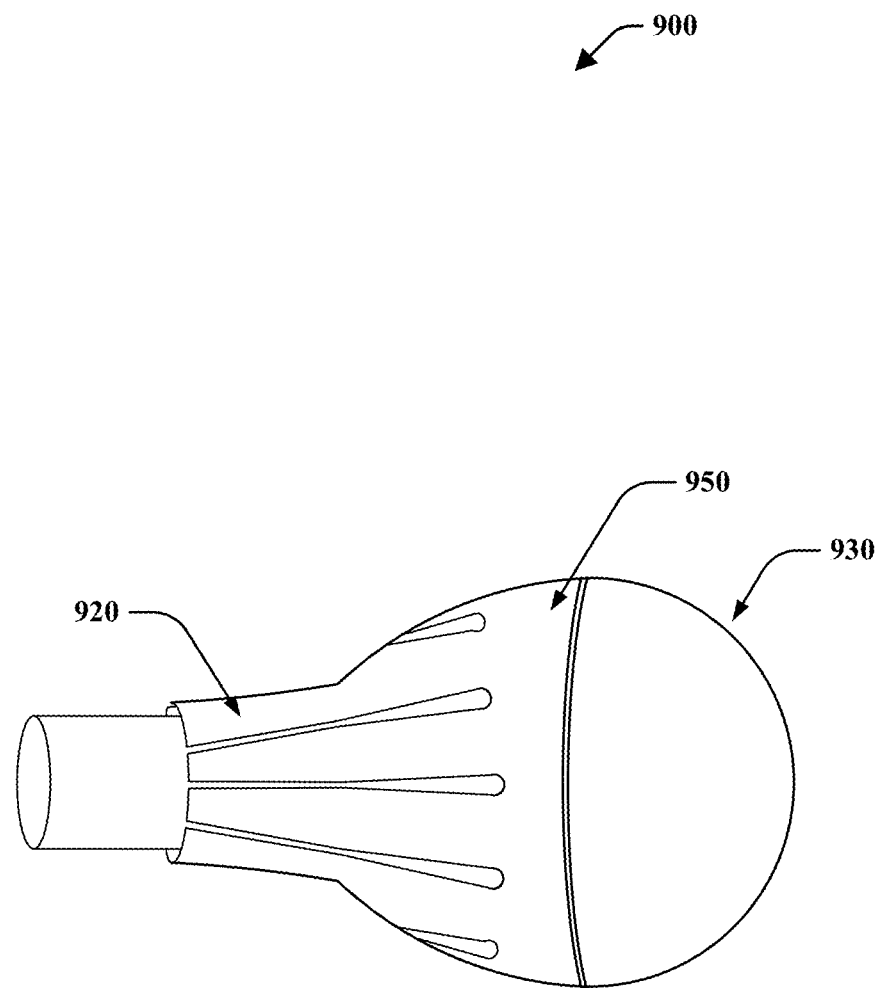
FIG. 9 illustrates a perspective view of another a light emitting diode assembly comprising a bulb shaped configuration in accordance with various embodiments herein.

FIG. 9 illustrates a light bulb shaped light emitting diode assembly 900. As depicted, light emitting diode 930 may comprise a globe or partial globe shape. Fin members 920 are integrally formed with body member 950. Light emitting diode assembly 900 can be configured for use in lighting sockets, such as those of lamps, flood light fixtures, recessed lighting fixtures, or the likes. Thus, light emitting diode assembly 900 can comprise various other components or members to attach to such lighting sockets. Additionally, light emitting diode assembly 900 can be of various dimensions based on desired use.

What has been described above includes examples of the present specification. It is, of course, not possible to describe every conceivable combination of components or methodologies for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

EXAMPLES

Aspects of this disclosure will now be described and may be further understood with respect to the following examples. The examples are intended to be illustrative only and are to be understood as not limiting the invention disclosed herein in any way as to materials, or process parameters, equipment or conditions.

Figure 10:
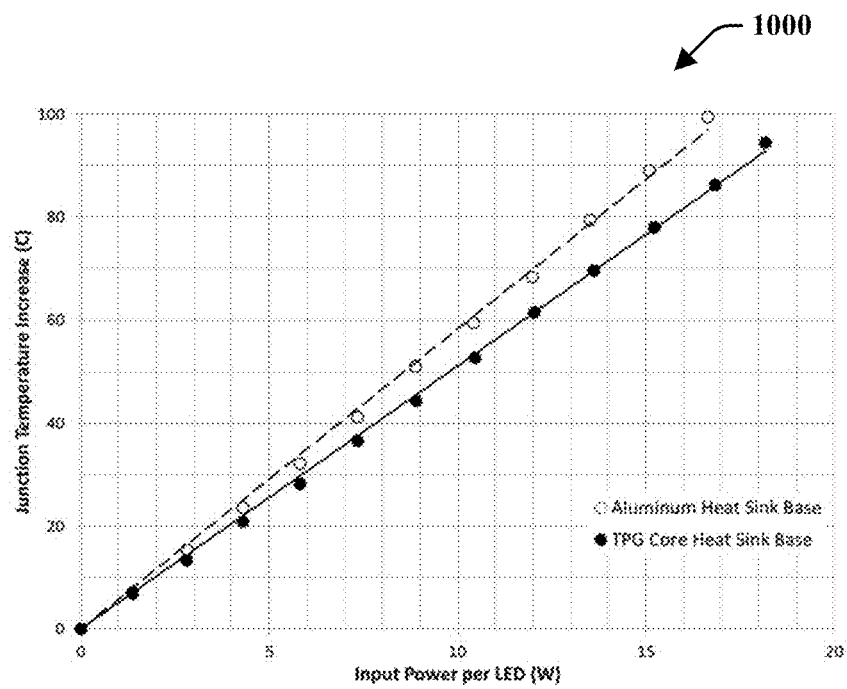
FIG. 10 is a graph illustrating thermal resistance of a thermal management assembly comprising a thermal pyrolytic graphite core in accordance with aspects of this disclosure.

In a first example, a light emitting diode assembly comprised a thermal pyrolytic graphite core member, such as light emitting diode assembly 100. The thermal management assembly comprising a thermal pyrolytic core member was compared to a standard aluminum thermal management assembly, each assembly was connected to or comprised a light emitting diode. Thermal resistance of each assembly was measured as the slope of light emitting diode junction temperature as a function of input power and is shown in graph 1000 of FIG. 10. The measured total thermal resistance of the thermal management assembly comprising a thermal pyrolytic core member was reduced, with respect to the aluminum thermal management assembly, to 5.1° C./W from the base line 5.8° C./W as measured in association with the aluminum thermal management assembly. It is noted that about 14% more power may be applied to the light emitting diode connected to the thermal management assembly comprising a thermal pyrolytic core member without increasing the light emitting diode junction temperature. In an aspect, the thermal management assembly comprising a thermal pyrolytic core member significantly improved heat transport from light emitting diodes and to fan members.

Figure 11:
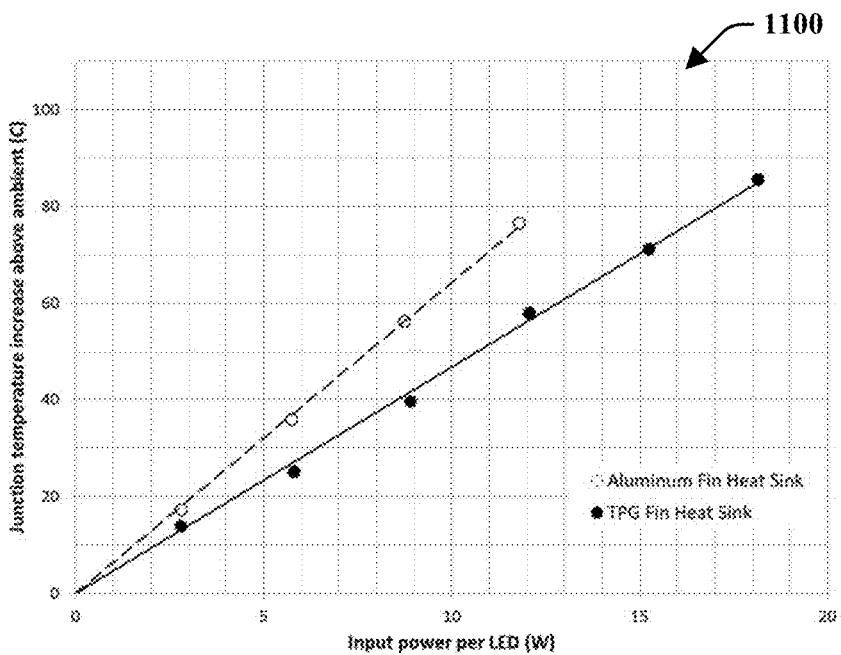
FIG. 11 is a graph illustrating thermal resistance of a thermal management assembly comprising thermal pyrolytic graphite fin members in accordance with aspects of this disclosure.

In a second example, a light emitting diode assembly comprised nine elongated thermal pyrolytic fin members, such as light emitting diode assembly 400. It is noted that different size fin members, number of fin members, or the likes can be utilized in accordance with various aspects disclosed herein. In this example, nine fin members were utilized for simplicity of construction. Furthermore, the fin members were about 3.75 inches long. The thermal management assembly comprised thermal pyrolytic graphite fin members but did not comprise a thermal pyrolytic graphite core member. This assembly was compared to an all aluminum assembly. Thermal resistance of each assembly was measured as shown in graph 1100 of FIG. 11. The measured total thermal resistance of the thermal management assembly comprising thermal pyrolytic graphite fin members was reduced from 6.4° C./W, with respect to the aluminum thermal management assembly, to 4.7° C./W. About a 39% increase of the total possible power loading to the light emitting diodes may be expected with this thermal pyrolytic graphite fin members embodiment.

Figure 12:
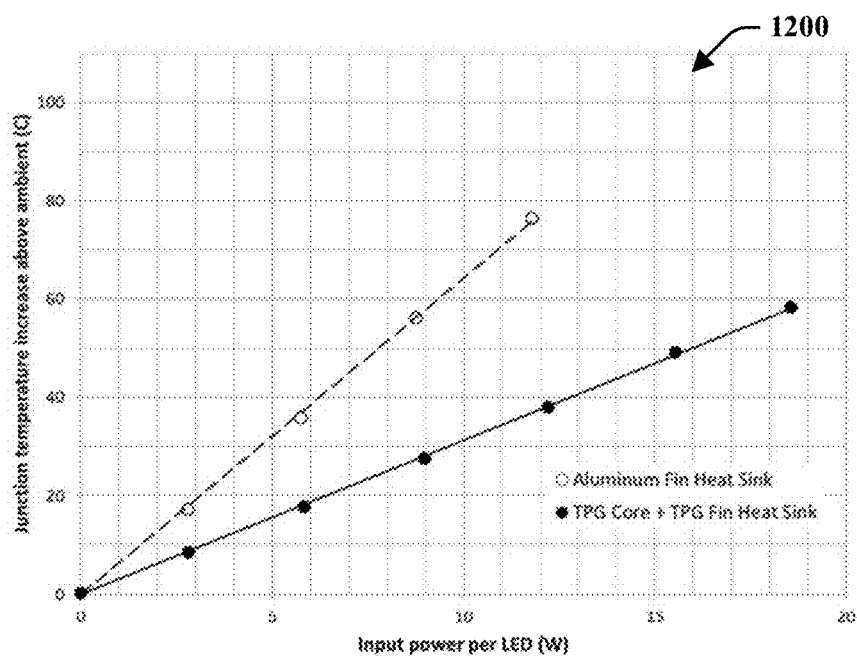
FIG. 12 is a graph illustrating thermal resistance of a thermal management assembly comprising a thermal pyrolytic graphite core and fin members in accordance with aspects of this disclosure.
Figure 13:
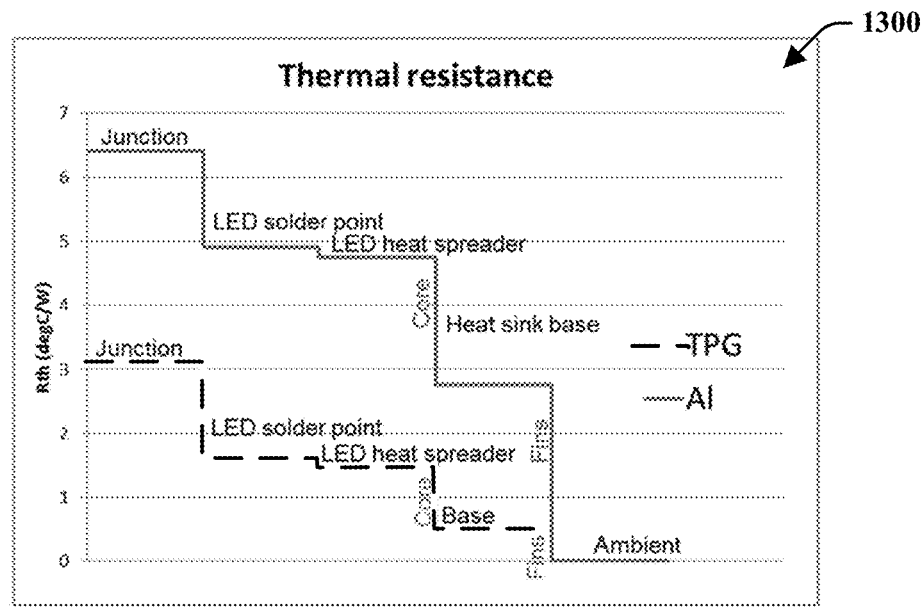
FIG. 13 is a graph illustrating thermal resistance reduction of a thermal management assembly comprising a thermal pyrolytic graphite core and fin members in accordance with aspects of this disclosure.

In a third example, a light emitting diode assembly comprised nine elongated thermal pyrolytic graphite fin members and a thermal pyrolytic graphite core member, such as light emitting diode assembly 500. Measurements from the thermal management assembly were compared with an aluminum thermal management assembly as shown in graphs 1200 and 1300 of FIGS. 12 and 13 respectively. The thermal management assembly of the third example reduced thermal resistance to 3.1° C./W, which was 51% less than the aluminum type. It is noted that light emitting diode power output can be more than doubled in comparison with possible power delivery to light emitting diodes connected to aluminum thermal management assemblies.

The foregoing description identifies various non-limiting embodiments of a light emitting diode assembly. Modifications may occur to those skilled in the art and to those who may make and use the invention. The disclosed embodiments are merely for illustrative purposes and not intended to limit the scope of the invention or the subject matter set forth in the claims.

What is claimed is:

1. A light emitting diode assembly comprising at least one light emitting diode and a thermal management assembly, the thermal management assembly comprising:
   a body member in thermal communication with the light emitting diode; and
   a fin member extending from and in thermal communication with the body member,
   wherein the fin member partially comprises a thermal pyrolytic graphite material disposed between a first substrate and a second substrate, and
   wherein the fin member further comprises interlayers disposed between the thermal pyrolytic graphite and the first substrate, and between the thermal pyrolytic graphite and the second substrate, wherein the interlayers comprise a metal-based material and form a carbide with the thermal pyrolytic graphite.

2. The light emitting diode assembly of claim 1, wherein the light emitting diode assembly comprises a thermal management assembly for an automotive headlight device.

3. The light emitting diode assembly of claim 1, the metal-based material of the interlayers of the fin member comprises an activating material that is chosen from titanium, zirconium, hafnium, aluminum, tantalum, iron, silicon, or a combination of two or more thereof to form the carbide.

4. The light emitting diode assembly of claim 1, wherein the first substrate and the second substrate of the fin member are independently formed from (i) a metal chosen from copper, aluminum, tungsten, molybdenum, nickel, iron, tin, silver, gold, beryllium, or an alloy of two or more thereof, or (ii) a ceramic material chosen from a silicon nitride, a silicon carbide, an aluminum nitride, an aluminum oxide, a beryllium oxide, or boron nitride.

5. The light emitting diode assembly of claim 1, wherein the body member comprises a thermal pyrolytic graphite material disposed between a first substrate and a second substrate.

6. The light emitting diode assembly of claim 5, wherein the body comprises an interlayer disposed between the thermal pyrolytic graphite and the first substrate, and an interlayer disposed between the thermal pyrolytic graphite and the second substrate, wherein the interlayers comprise a metal-based material and form a carbide with the thermal pyrolytic graphite.

7. The light emitting diode assembly of claim 6, wherein the interlayers of the body comprise a metal based material comprising an activating material that is chosen from titanium, zirconium, hafnium, aluminum, tantalum, iron, silicon, or a combination of two or more thereof to form a carbide.

8. The light emitting diode assembly of claim 6, wherein the first substrate and the second substrate of the body are independently formed from (i) a metal chosen from copper, aluminum, tungsten, molybdenum, nickel, iron, tin, silver, gold, beryllium, or an alloy of two or more thereof, or (ii) a ceramic material chosen from a silicon nitride, a silicon carbide, an aluminum nitride, an aluminum oxide, a beryllium oxide, or boron nitride.

9. A light emitting diode assembly, comprising:
at least one light emitting diode;
a body member in thermal communication with the at least one light emitting diode; and
at least one fin member extending from and in thermal communication with the body member,
wherein a fin member of the at least one fin member partially comprises a thermal pyrolytic graphite material disposed between a first substrate and a second substrate, and
wherein the fin member further comprises interlayers disposed between the thermal pyrolytic graphite and the first substrate, and between the thermal pyrolytic graphite and the second substrate, wherein the interlayers comprise a metal-based material.

10. The light emitting diode assembly of claim 9, wherein the body member further comprises an electrical connection coupled to the at least one light emitting diode.

11. The light emitting diode assembly of claim 9, wherein the metal-based material of the interlayers of the fin member comprises an activating material that is chosen from titanium, zirconium, hafnium, aluminum, tantalum, iron, silicon, or a combination of two or more thereof to form a carbide.

12. The light emitting diode assembly of claim 9, wherein the first substrate and the second substrate of the fin member are independently formed from (i) a metal chosen from copper, aluminum, tungsten, molybdenum, nickel, iron, tin, silver, gold, beryllium, or an alloy of two or more thereof, or (ii) a ceramic material chosen from a silicon nitride, a silicon carbide, an aluminum nitride, an aluminum oxide, a beryllium oxide, or boron nitride.

13. The light emitting diode assembly of claim 9, wherein the body member comprises a thermal pyrolytic graphite material disposed between a first substrate and a second substrate.

14. The light emitting diode assembly of claim 13, wherein the body comprises an interlayer disposed between the thermal pyrolytic graphite and the first substrate, and an interlayer disposed between the thermal pyrolytic graphite and the second substrate, wherein the interlayers of the body comprise a metal-based material and form a carbide with the thermal pyrolytic graphite.

15. The light emitting diode assembly of claim 14, wherein the interlayers of the body comprise a metal based material comprising an activating material that is chosen from titanium, zirconium, hafnium, aluminum, tantalum, iron, silicon, or a combination of two or more thereof.

16. The light emitting diode assembly of claim 13, wherein the first substrate and the second substrate of the body are independently formed from (i) a metal chosen from copper, aluminum, tungsten, molybdenum, nickel, iron, tin, silver, gold, beryllium, or an alloy of two or more thereof, or (ii) a ceramic material chosen from a silicon nitride, a silicon carbide, an aluminum nitride, an aluminum oxide, a beryllium oxide, or boron nitride.

* * * * *